(12) United States Patent
Roh et al.

(10) Patent No.: US 7,888,245 B2
(45) Date of Patent: Feb. 15, 2011

(54) PLASMA DOPING METHOD AND METHOD FOR FABRICATING SEMICONDUCTOR DEVICE USING THE SAME

(75) Inventors: Jae-Sung Roh, Ichon-shi (KR);
Jae-Geun Oh, Ichon-shi (KR);
Hyun-Chul Sohn, Ichon-shi (KR);
Sun-Hwan Hwang, Ichon-shi (KR);
Jin-Ku Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 431 days.

(21) Appl. No.: 11/743,670

(22) Filed: May 3, 2007

(65) Prior Publication Data

US 2007/0264808 A1    Nov. 15, 2007

(30) Foreign Application Priority Data

May 11, 2006  (KR) .................. 10-2006-0042509
Mar. 5, 2007   (KR) .................. 10-2007-0021346

(51) Int. Cl.
*H01L 21/20*    (2006.01)

(52) U.S. Cl. ....................... 438/485; 438/513

(58) Field of Classification Search ................ 438/513, 438/485, 792, 788
See application file for complete search history.

(56) References Cited

U.S. PATENT DOCUMENTS 4,912,065 A    3/1990   Mizuno et al.
6,020,592 A    2/2000   Liebert et al.
6,359,310 B1   3/2002   Gonzalez et al.
7,442,631 B2 * 10/2008  Koezuka et al. ............. 438/515
2001/0007357 A1 * 7/2001 Zhang et al. .................... 257/59
2005/0277273 A1 * 12/2005 Sasaki et al. ................. 438/479
2006/0019477 A1 * 1/2006  Hanawa et al. ............... 438/514
2006/0081558 A1 * 4/2006  Collins et al. .................. 216/67
2006/0177996 A1 * 8/2006  Koezuka et al. ............. 438/513
2006/0289799 A1 * 12/2006 Fang et al. ............. 250/492.21
2007/0119546 A1 * 5/2007  Collins et al. .......... 156/345.48

FOREIGN PATENT DOCUMENTS

| CN | 1213159 | 4/1999 |
|---|---|---|
| CN | 1519915 | 8/2004 |
| EP | 1055745 A1 | 11/2000 |
| JP | 07-106265 | 4/1995 |
| JP | 10-012612 | 1/1998 |
| KR | 1988-0014650 | 12/1988 |
| KR | 1020000075426 A | 12/2000 |
| KR | 1020040007336 A | 1/2004 |
| KR | 1020060001327 A | 1/2006 |

OTHER PUBLICATIONS

Korean Intellectual Property Office, Notice of Preliminary Rejection, Application No. 10-2007-0021346, Mar. 13, 2008.

* cited by examiner

*Primary Examiner*—Thao P. Le
(74) *Attorney, Agent, or Firm*—Kilpatrick Townsend & Stockton LLP

(57) ABSTRACT

A plasma doping method includes providing a doping source over a substrate. The doping source includes dopants that are to be injected into the substrate. At least two different bias voltages are applied to inject the dopants from the doping source to the substrate.

14 Claims, 7 Drawing Sheets

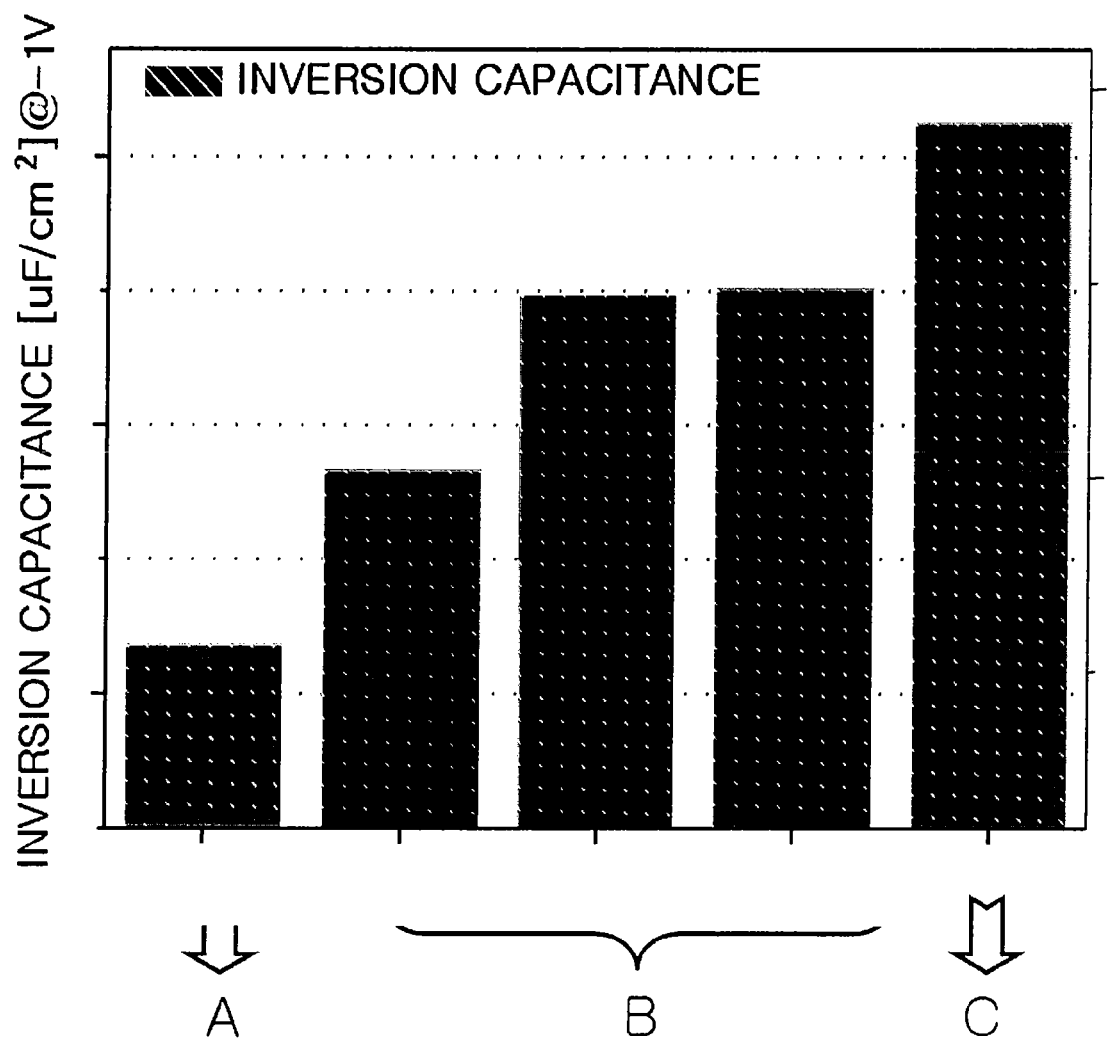

PLASMA DOPING METHOD AND METHOD FOR FABRICATING SEMICONDUCTOR DEVICE USING THE SAME

CROSS-REFERENCE TO RELATED APPLICATIONS

The present invention claims priority of Korean patent application numbers 10-2006-0042509 and 10-2007-0021346 respectively filed on May 11, 2006 and Mar. 5, 2007 which are incorporated by reference in their entirety.

BACKGROUND OF THE INVENTION

The present invention relates to a method for fabricating a semiconductor device, and more particularly, to a plasma doping method performed on a substrate or a thin layer.

Typically, doping is performed to obtain a desirable electrical property of a substrate or a thin layer such as polysilicon during the fabrication of a semiconductor device. A beam line ion implantation method is mainly used as a doping method. The beam line ion implantation method uses an electrical field to accelerate ions to be implanted (i.e., provide high kinetic energy). The accelerated ions collide against a surface of a solid state material. As a result, the ions may be implanted into the substrate.

Recently, a plasma doping method has been used. In the plasma doping method, a source material for the ions to be implanted is in a gas state. A plasma is formed and then, a high voltage bias is applied to a sample to be doped. As a result, positive ions of the plasma accelerate into a surface of the sample and are implanted thereto. Accordingly, the plasma doping method may perform a uniform doping, and improve a doping rate. Furthermore, since the plasma doping method does not need to use a separate ion generating source (i.e., an ion beam) and acceleration apparatus as compared with the beam ion implantation method, an equipment fabrication cost may be reduced.

FIGS. 1A to 1C illustrate a typical method for fabricating a semiconductor device. As shown in FIG. 1A, a plurality of device isolation layers 12 are formed in sections of a substrate 11. A gate insulation layer 13 is formed over the substrate 11, and a gate polysilicon layer 14 is formed over the gate insulation layer 13. A plasma doping method is performed to dope the gate polysilicon layer 14 with a P-type impurity.

As shown in FIG. 1B, an anneal process is performed to activate the P-type impurity doping in the gate polysilicon layer 14.

As shown in FIG. 1C, a metal silicide layer such as a gate tungsten silicide layer 15 is formed over the gate polysilicon layer 14 and then, a gate patterning process is performed as a subsequent process. If the plasma doping method is performed according to the description above, an excessive concentration of impurities may exist over a top surface of a thin layer.

FIG. 2 is a graph illustrating typical profiles of impurities doped via a beam line ion implantation method and a plasma doping method onto a sample in which a gate polysilicon layer is formed. A horizontal axis represents a depth of the sample, and a vertical axis represents a concentration of boron, which is used as a P-type impurity. A depth of about 800 Å identifies a depth of an interface between a top surface of the gate oxide layer and a gate polysilicon layer. In more detail, a depth of the gate polysilicon layer is about 800 Å. With reference to FIG. 2, the impurity profile obtained via the plasma doping method is compared with that obtained via the ion implantation method. The impurity concentration is relatively larger at the top surface of the gate polysilicon layer (e.g., at a portion of the gate polysilicon layer corresponding to a depth of about 0 Å) when performing the plasma doping method than in the beam line ion implantation. Particularly, while the impurity concentration shows a Gaussian distribution at about 200 Å in the beam line ion implantation method, the impurity concentration is the largest at the top surface of the gate polysilicon layer in the plasma doping method.

FIG. 3 is a graph illustrating typical profiles of impurities doped via a beam line ion implantation method and plasma doping methods after an annealing process is performed. Reference denotations ■ and ● represent different types of impurities used in the plasma doping methods. The impurity is activated down to a bottom surface of a gate polysilicon layer (e.g., around a top surface of a gate oxide layer) via the annealing process. In the case of performing the plasma doping methods, the largest impurity concentrations are measured at the top surface of the gate polysilicon layer, i.e., at a depth of about 0 Å of the gate polysilicon layer.

As shown in FIGS. 2 and 3, if the plasma doping methods are performed, a large amount of the impurity may exist over the top surface of the gate polysilicon layer although the annealing process is performed. The impurity existing over the top surface of the gate polysilicon layer is diffused out toward an upper layer of the gate polysilicon layer, e.g., a metal silicide layer, during a subsequent annealing process. Accordingly, a doping effect is abruptly reduced around the surface of the gate polysilicon layer. That is, a relative impurity depletion effect may be generated at the surface of the gate polysilicon layer. The reduction in the doping effect brings an increase in resistance of the gate polysilicon layer. Furthermore, a saturation current property of a P-type metal oxide semiconductor (PMOS) transistor having a gate formed of polysilicon doped with a $P^+$-type impurity may be degraded.

SUMMARY OF THE INVENTION

Embodiments of the present invention relate to a plasma doping method which reduces a concentration spike around the surface of the top layer.

Embodiments of the present invention are directed toward providing a method for fabricating a semiconductor device, wherein the method can prevent an out-diffusion of an impurity within a gate polysilicon layer, thereby reducing an impurity depletion effect of the gate polysilicon layer.

In one embodiment, a plasma doping method includes providing a doping source over a substrate, wherein the doping source having dopants that are to be injected into the substrate. At least two different bias voltages are applied to inject the dopants from the doping source to the substrate.

In another embodiment, a method for fabricating a semiconductor device includes forming a polysilicon layer over a substrate. The polysilicon is doped with impurities using a plasma doping method, wherein the plasma doping method is performed using at least two different bias voltages.

BRIEF DESCRIPTION OF THE DRAWINGS

FIG. 5 is a graph illustrating inversion capacitance obtained for various types of doping methods.

DESCRIPTION OF SPECIFIC EMBODIMENTS

According to embodiments of the present invention, a plasma doping method can be applied to various steps of a semiconductor device fabrication process. For instance, the plasma doping method can be applied to doping a bulk substrate formed of a semiconductor material such as silicon. The semiconductor material is an epitaxial layer. Also, the plasma doping method can be applied to doping a thin layer formed over an upper portion of a substrate. Particularly, the plasma doping method according to the embodiments of the present invention can be useful in doping a gate polysilicon layer.

Figure 1A:
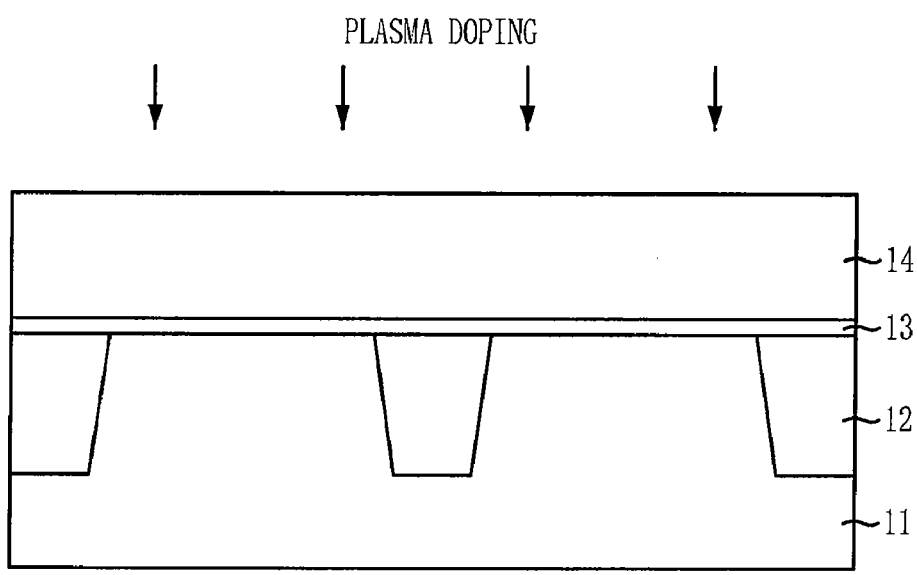
FIGS. 1A to 1C illustrate a typical method for fabricating a semiconductor device.
Figure 1B:
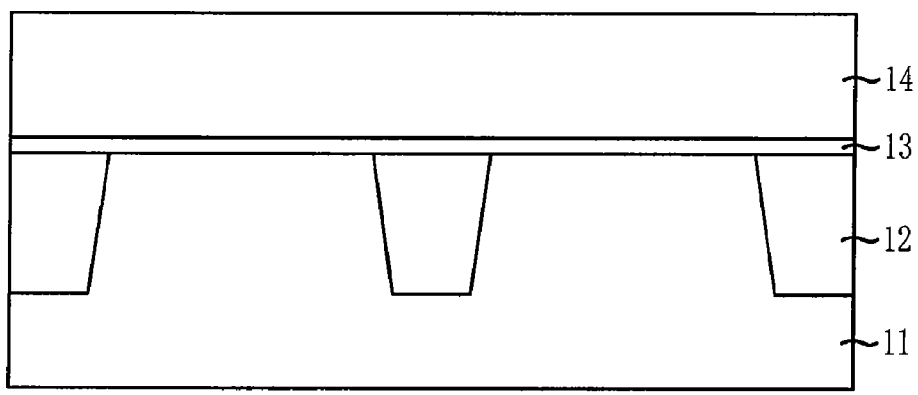
Figure 1C:
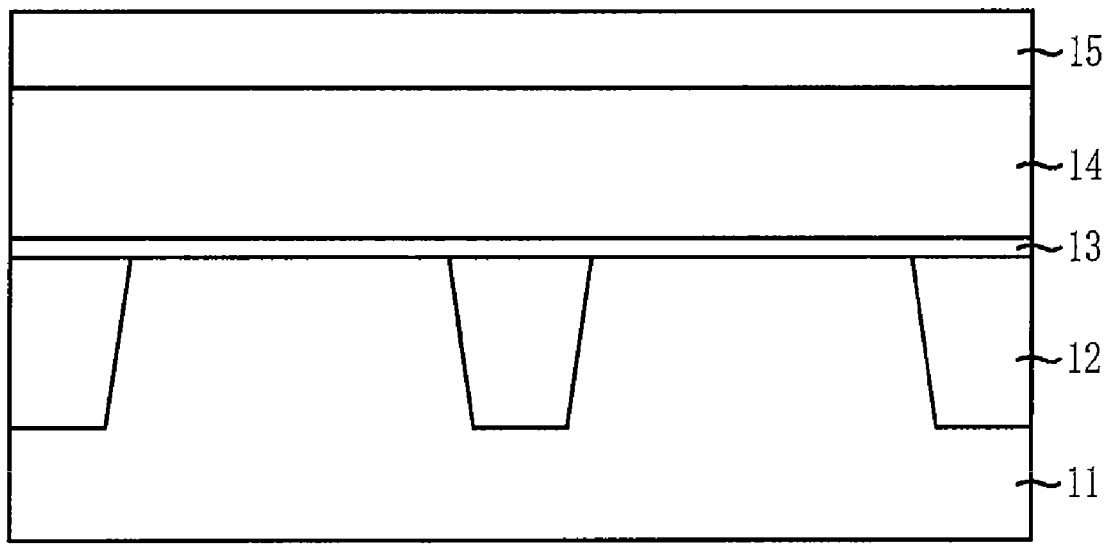
Figure 2:
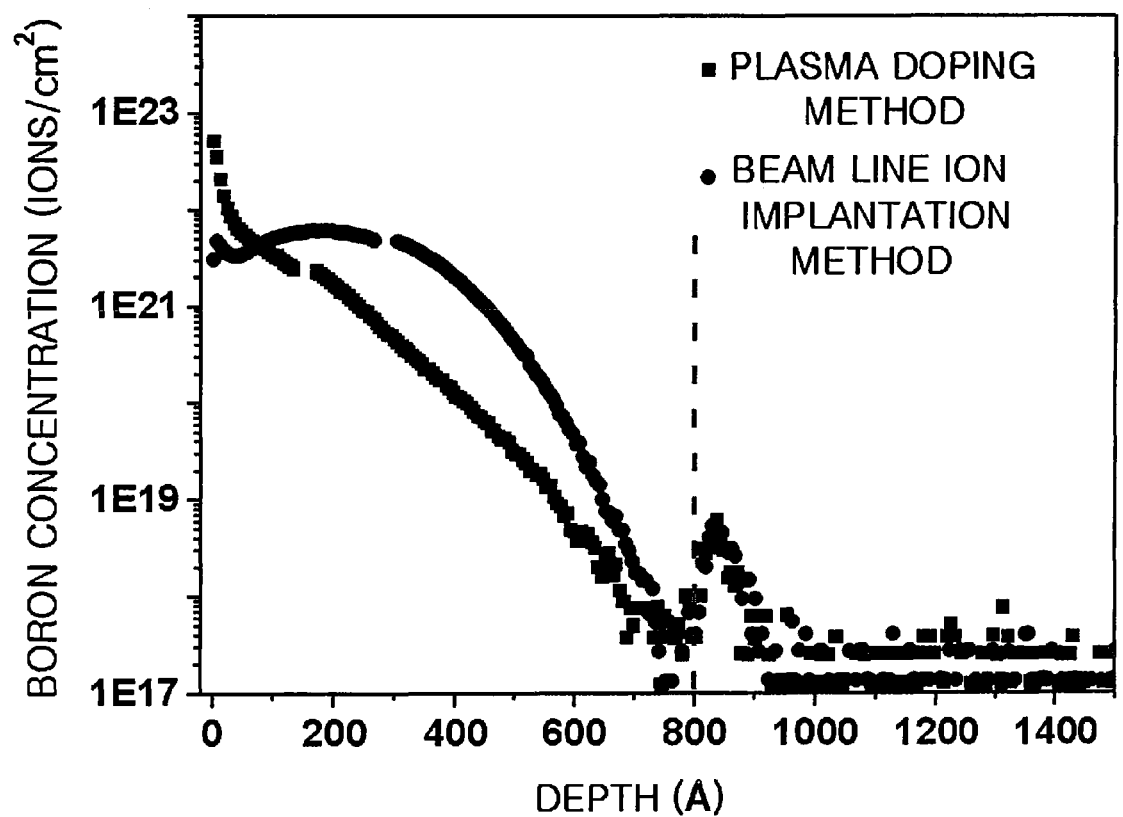
FIG. 2 is a graph illustrating typical profiles of impurities doped respectively via a beam line ion implantation method and a plasma doping method.
Figure 3:
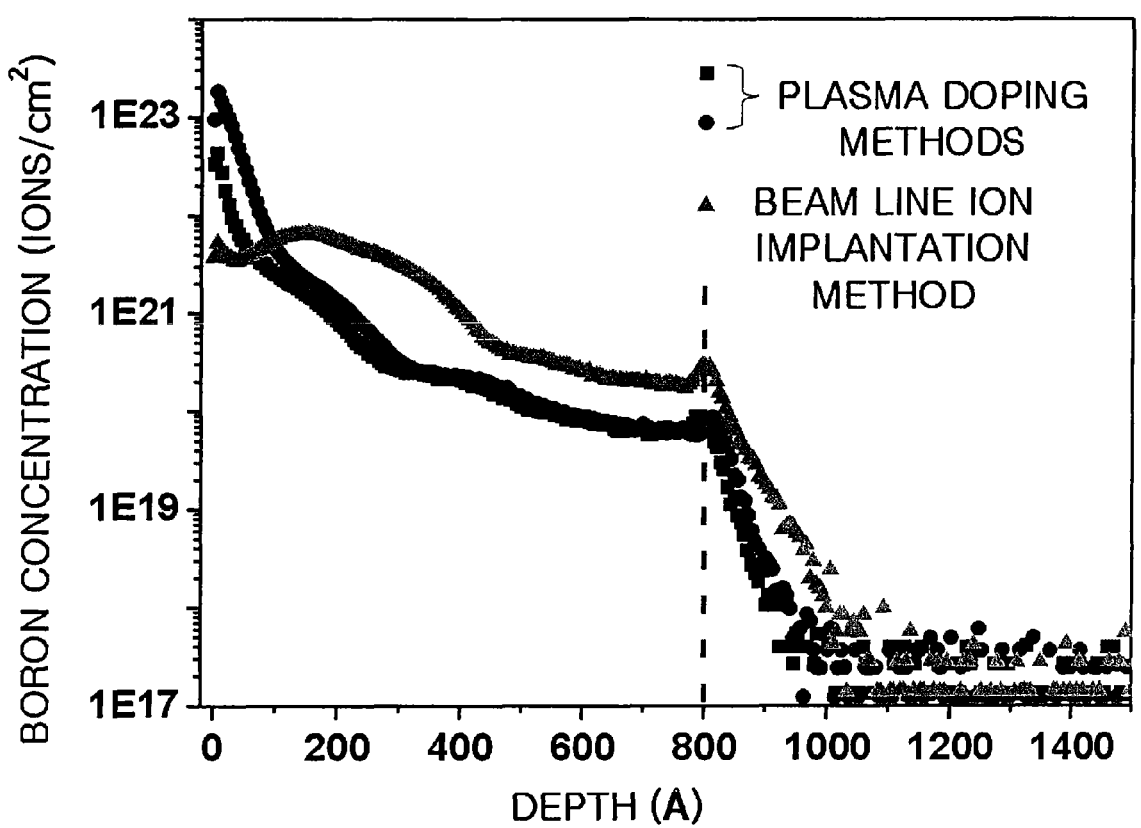
FIG. 3 is a graph illustrating typical profiles of impurities doped respectively via a beam line ion implantation method and plasma doping methods after an annealing process is performed.
Figure 4A:
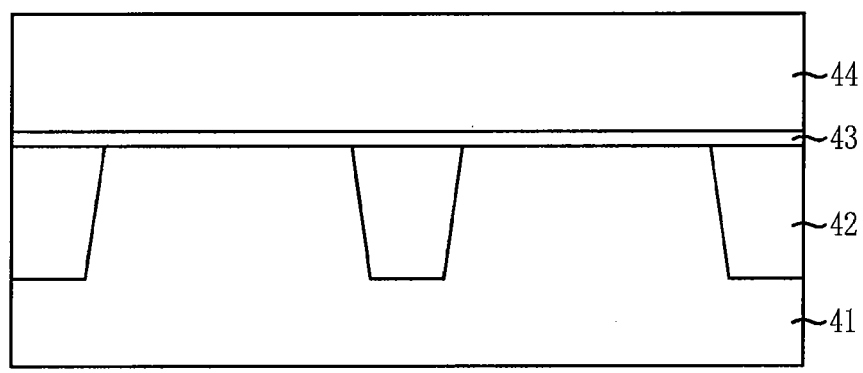
FIGS. 4A to 4D illustrate a method for fabricating a semiconductor device in accordance with an embodiment of the present invention.

FIGS. 4A to 4D illustrate a method for fabricating a semiconductor device in accordance with an embodiment of the present invention. As shown in FIG. 4A, a plurality of device isolation layers 42 are formed in a substrate 41 such as a silicon substrate. The device isolation layers 42 are formed via a shallow trench isolation (STI) method.

A gate insulation layer 43 is formed over the substrate 41. The gate insulation layer 43 can be an oxide layer formed via a thermal oxidation method, a dry oxidation method or a wet oxidation method.

A gate polysilicon layer 44 for a gate electrode is formed over the gate insulation layer 43. A depth of the gate polysilicon layer 44 ranges from about 400 Å to about 1,200 Å in a highly integrated memory device. However, the depth of the gate polysilicon layer 44 may change according to the types of devices.

Figure 4B:
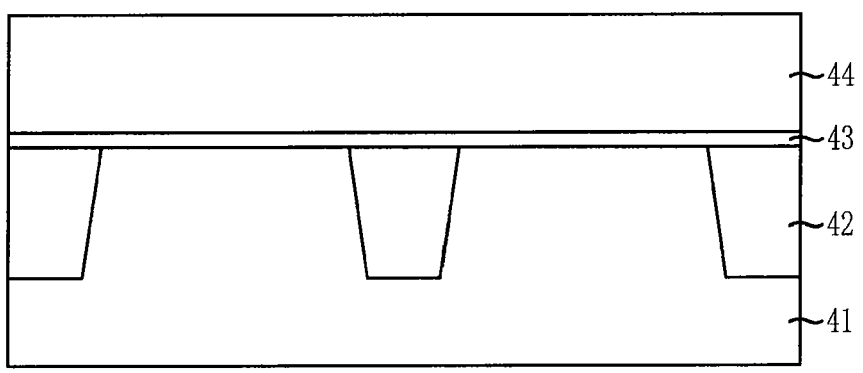

As shown in FIG. 4B, a plasma doping method is performed while varying the magnitude of a bias voltage to dope the gate polysilicon layer 44. In more detail, a doping source gas is added to an upper portion of the gate polysilicon layer 44. Then, the source gas is transformed into plasma ions, and the plasma ions accelerate into the gate polysilicon layer 44 by adding the bias voltage to the substrate 41. According to an embodiment of the present invention, the magnitude of the bias voltage is not constant but varied sequentially. In the case of doping boron (B) which is a P-type impurity, boron trifluoride ($BF_3$) or diborane ($B_2H_6$) is used as the source gas.

The magnitude of the bias voltage changes from a low voltage level to a high voltage level or from a high voltage level to a low voltage level during the plasma doping method. Particularly, if a reference bias voltage ($V_{ref}$) is set at about 8 kV, the magnitude of the bias voltage can change within a range of about 8 kV±2 kV. For instance, if the reference bias voltage ($V_{ref}$) of about 8 kV is used, the doping proceeds with applying the bias voltage ascending from about 6 kV to about 10 kV or descending from about 10 kV to about 6 kV. Accordingly, if the plasma doping method is performed while changing the magnitude of the bias voltage, an impurity profile, which is similar to that obtained from a beam line ion implantation method, can be obtained. Particularly, the impurity profile shows the Gaussian distribution on the basis of a portion lower than the top surface of the gate polysilicon layer 44.

During the plasma doping method, a doping dose can be uniformly maintained for each magnitude of the bias voltage. In more detail, the plasma doping method is performed using a dosage of about $1 \times 10^{16}$ atoms/cm$^2$ at each magnitude of the bias voltages of about 10 kV, about 9 kV, about 8 kV, about 7 kV, and about 6 kV.

Furthermore, during the plasma doping method, the doping dose can change as the magnitude of the bias voltage changes. When the reference bias voltage is added, the highest dose is used. As a result, the impurity profile shows the Gaussian distribution. As an example, if the plasma doping method is performed in three steps using a dosage of about $5 \times 10^{16}$ atoms/cm$^2$ and adding the bias voltage with the magnitude changing from about 10 kV to about 6 kV, a dosage of about $1 \times 10^{16}$ atoms/cm$^2$ is used at the bias voltage with the magnitude of about 10 kV; a dosage of about $3 \times 10^{16}$ atoms/cm$^2$ is used at the bias voltage with the magnitude of about 8 kV; and a dosage of about $1 \times 10^{16}$ atoms/cm$^2$ is used at the bias voltage with the magnitude of about 6 kV.

Figure 4C:
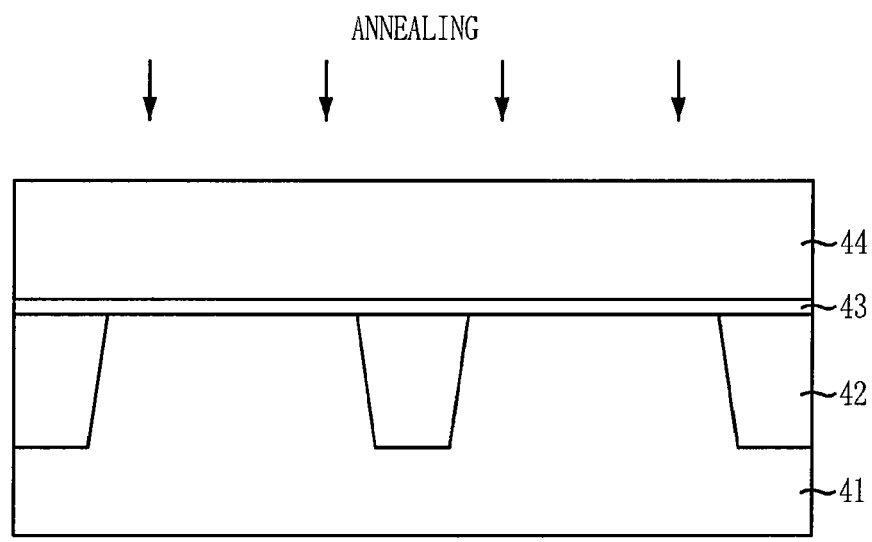

As shown in FIG. 4C, an annealing process is performed to activate the impurity doped within the gate polysilicon layer 44. Due to the annealing process, the impurity is activated toward the gate insulation layer 43. The annealing process includes using a rapid thermal process (RTP), and the RTP is performed for about 1 second to about 60 seconds at a temperature ranging from about 850° C. to about 1,100° C.

As described above, if the plasma doping method is performed while changing the magnitude of the bias voltage, the impurity profile can show the Gaussian distribution near the top surface of the gate polysilicon layer 44 similar to that obtained by the beam line ion implantation method.

Figure 4D:
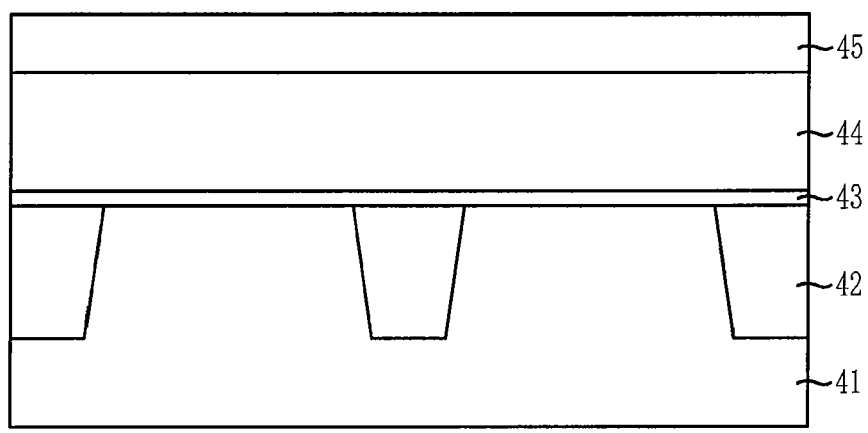

As shown in FIG. 4D, a tungsten silicide layer 45 is formed over the gate polysilicon layer 44. Instead of using the tungsten silicide layer 45, other metal silicide layers or metal layers other than silicide layers can be used.

After the tungsten silicide layer 45 is formed, a thermal process is employed as a subsequent process. However, since the impurity within the gate polysilicon layer 44 is mainly distributed at a central portion of the gate polysilicon layer 44, an out-diffusion toward the tungsten silicide layer 45 can be controlled although the thermal process is performed. Accordingly, an increase in the resistance of the gate polysilicon layer 44 can be prevented, and a saturation current property of a P-type metal oxide semiconductor (PMOS) transistor is not degraded.

FIG. 5 is a graph illustrating inversion capacitance for each type of doping methods. Reference letter A identifies a method typically performed by implanting boron. Reference letter B identifies a plasma doping method typically performed without changing a magnitude of a bias voltage. Reference letter C identifies another plasma doping method performed while changing a magnitude of a bias voltage according to an embodiment of the present invention. Referring to FIG. 5, the inversion capacitance for each type of the doping methods labeled as A, B, and C is compared.

A level of the inversion capacitance is the largest when the method C is applied. As the level of the inversion capacitance is smaller, a threshold voltage of a device is increased, thereby degrading an operation property of the device. Accordingly, since the level of the inversion capacitance is increased applying the plasma doping method according to an embodiment of the present invention, the device property can be improved.

According to an embodiment of the present invention, the plasma doping method is performed while changing the magnitude of the bias voltage. As a result of the plasma doping method, the impurity profile can show the Gaussian distribution near the top surface of the thin layer as similar to that obtained by the typical beam line ion implantation method. Accordingly, the out-diffusion of the impurity can be reduced and thus, degradation in an electrical property of the device can be reduced as well.

While the present invention has been described with respect to the specific embodiments, it will be apparent to those skilled in the art that various changes and modifications may be made without departing from the spirit and scope of the invention as defined in the following claims.

What is claimed is:

1. A plasma doping method comprising:
providing a plasma doping source over a substrate, the plasma doping source having dopants that are to be injected into a target layer formed over the substrate;
injecting the dopants from the plasma doping source into the target layer while applying a bias voltage to the substrate, the bias voltage being changed from a lower range, through a medium range to a higher range and the dosage of the dopants in the medium range is higher than those in the lower range and higher range; and
annealing the substrate such that an impurity profile of the dopants resembles a Gaussian distribution with respect to a doping depth.

2. The doping method of claim 1, wherein a dosage of the dopants injected into the substrate varies as a function of a magnitude of the changed bias voltage.

3. The doping method of claim 1, wherein the target layer includes one of a polysilicon layer and an epitaxial layer.

4. A method for fabricating a semiconductor device, the method comprising:
forming a gate insulation layer over a substrate;
forming a polysilicon layer over the gate insulation layer;
doping the polysilicon layer with impurities by performing a plasma doping method, wherein the plasma doping method is performed while applying a bias voltage to the substrate, the bias voltage being changed from a lower range, through a medium range to a higher range and the dosage of the impurities in the medium range is higher than those in the lower range and higher range;
annealing the substrate such that an impurity profile of the doped polysilicon layer resembles a Gaussian distribution with respect to a doping depth; and
forming a conductive layer including a metal-based material over the doped polysilicon layer.

5. The method of claim 4, wherein the annealing includes using a rapid thermal process.

6. The method of claim 4, wherein the polysilicon layer is used to define a gate electrode.

7. The method of claim 4, wherein doping the polysilicon layer with impurities further comprises:
providing a source gas over the polysilicon layer;
converting the source gas into plasma ions; and
accelerating the plasma ions toward the polysilicon layer by applying the bias voltage.

8. The method of claim 7, wherein the source gas is obtained using diborane ($B_2H_6$).

9. The method of claim 4, wherein the polysilicon layer has a depth ranging from about 400 Å to about 1,200 Å.

10. The method of claim 4, wherein a magnitude of the bias voltage changes within a range of about 8 kV±2 kV.

11. The method of claim 1, wherein the annealing includes using a rapid thermal process.

12. The method of claim 1, wherein the plasma doping source includes diborane ($B_2H_6$).

13. The method of claim 1, wherein a magnitude of the bias voltage changes within a range of about 8 kV±2 kV.

14. A plasma doping method comprising:
providing a plasma doping source over a substrate, the plasma doping source having dopants that are to be injected into a target layer formed over the substrate;
injecting the dopants from the plasma doping source into the target layer while applying a bias voltage to the substrate, the bias voltage being changed from a higher range, through a medium range to a lower range and the dosage of the dopants in the medium range is higher than those in the lower range and higher range; and
annealing the substrate such that an impurity profile of the dopants resembles a Gaussian distribution with respect to a doping depth.

* * * * *